(12) United States Patent
Xu et al.

(10) Patent No.: US 10,962,605 B2
(45) Date of Patent: Mar. 30, 2021

(54) METHOD FOR DETECTING INSULATION DAMAGE LOCATION IN REFLUX RAIL OF SUBWAY/COAL MINE AND TRANSITION RESISTANCE THEREOF

(71) Applicants: CHINA UNIVERSITY OF MINING AND TECHNOLOGY, Xuzhou (CN); XUZHOU ZHONGMINE TRANSMISSION TRACK TECHNOLOGY Co., Ltd, Xuzhou (CN)

(72) Inventors: Shaoyi Xu, Xuzhou (CN); Fangfang Xing, Xuzhou (CN); Wei Li, Xuzhou (CN); Yuqiao Wang, Xuzhou (CN); Yao Chen, Xuzhou (CN); Hongyu Xue, Xuzhou (CN)

(73) Assignees: CHINA UNIVERSITY OF MINING AND TECHNOLOGY, Xuzhou (CN); XUZHOU ZHONGMINE TRANSMISSION TRACK TECHNOLOGY CO., LTD, Xuzhou (CN)

( * ) Notice: Subject to any disclaimer, the term of this patent is extended or adjusted under 35 U.S.C. 154(b) by 0 days.

(21) Appl. No.: 16/636,916

(22) PCT Filed: Apr. 23, 2019

(86) PCT No.: PCT/CN2019/083798
§ 371 (c)(1),
(2) Date: Feb. 6, 2020

(65) Prior Publication Data
US 2020/0408850 A1    Dec. 31, 2020

(30) Foreign Application Priority Data

Nov. 19, 2018 (CN) .......................... 201811375321.4

(51) Int. Cl.
*G01R 31/52* (2020.01)
*G01R 27/20* (2006.01)

(52) U.S. Cl.
CPC ............. *G01R 31/52* (2020.01); *G01R 27/20* (2013.01)

(58) Field of Classification Search
CPC ................................ G01R 31/52; G01R 27/20
(Continued)

(56) References Cited

U.S. PATENT DOCUMENTS 1,765,715 A * 6/1930 Byers .................. G01R 27/18
324/705
2,614,151 A * 10/1952 Gilson .................... B61L 1/18
324/217
(Continued)

FOREIGN PATENT DOCUMENTS

AU    2019299873 A1 *  6/2020
CN       2475638 Y  *  2/2002
(Continued)

OTHER PUBLICATIONS

Lyuminarskaja et al., Theoretical study of electrical contact dustiness impact on the transition resistance, MATEC Web of Conferences 224, 02035 (2018) (Year: 2018).*

(Continued)

*Primary Examiner* — Patrick Assouad
*Assistant Examiner* — Sean Curtis
(74) *Attorney, Agent, or Firm* — Bayramoglu Law Offices LLC

(57) ABSTRACT

A method for detecting an insulation damage location in a reflux rail of a subway/coal mine and a transition resistance thereof includes the following steps: connecting a reflux rail to a negative electrode of a substation, selecting a location at a connecting point as a reference location, and mounting (Continued)

a potential detection apparatus at the reference location; mounting a travel distance detection apparatus and a traction current detection apparatus on a locomotive, traveling, by the locomotive, to the substation along the reflux rail, where the three detection apparatuses send respectively recorded data to a control unit; and determining, by the control unit, a potential jump from received potential data and a corresponding jump time, and determining a running distance of the locomotive at a jump moment and a total running length of the locomotive, so as to determine a ground insulation damage location.

5 Claims, 1 Drawing Sheet

(58) Field of Classification Search
USPC .......................................................... 324/509
See application file for complete search history.

(56) References Cited

U.S. PATENT DOCUMENTS

| | | | | | |
|---|---|---|---|---|---|
| 4,932,614 | A | * | 6/1990 | Birkin | B61L 1/02 246/187 B |
| 5,045,787 | A | * | 9/1991 | Auer, Jr. | G01R 31/52 324/217 |
| 6,252,408 | B1 | * | 6/2001 | Poole | B61L 1/185 324/525 |
| 2010/0023190 | A1 | * | 1/2010 | Kumar | G05B 13/021 701/20 |

FOREIGN PATENT DOCUMENTS

| | | | | |
|---|---|---|---|---|
| CN | 2475638 | Y | | 2/2002 |
| CN | 102175597 | A | * | 9/2011 |
| CN | 102175597 | A | | 9/2011 |
| CN | 205003207 | U | * | 1/2016 |
| CN | 205003207 | U | | 1/2016 |
| CN | 105699866 | A | | 6/2016 |
| CN | 106199201 | A | * | 12/2016 |
| CN | 106199201 | A | | 12/2016 |
| CN | 104764978 | B | * | 8/2017 |
| CN | 109444689 | A | | 3/2019 |
| CN | 109470927 | A | * | 3/2019 |
| JP | 2010242144 | A | | 10/2010 |

OTHER PUBLICATIONS

Wang et al., Stray Current Distributing Model in the Subway System: A review and outlook, Int. J. Electrochem. Sci., 13 (2018) (Year: 2018).*
Du et al., Effect of Over Zone Feeding on Rail Potential and Stray Current in DC Mass Transit System, Hindawi Publishing Corporation Mathematical Problems in Engineering vol. 2016, (Year: 2016).*
Pasic, Jasna. Calculation of Distance to Fault and Transition Resistance on the Fault Place on Electric Power System Lines. MIPRO 2011, May 23-27, 2011, Opatija, Croatia (Year: 2011).*
CN102175597A—English Translation (Year: 2020).*
CN106199201A—English Translation (Year: 2020).*
CN205003207U—English Translation (Year: 2020).*
CN2475638Y—English Translation (Year: 2020).*
CN104764978A—English Translation (Year: 2020).*
Liu Jianhua et al. "Fault Location of Track/Ground Local Insulation Defect Based on C-type Travelling Wave", China Academic Journal Electronic Publishing House, Sep. 2015.

* cited by examiner

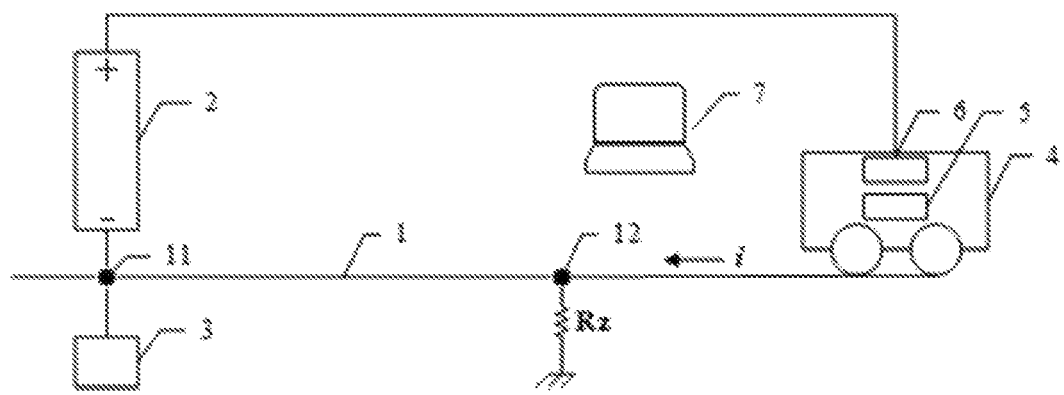

US 10,962,605 B2

METHOD FOR DETECTING INSULATION DAMAGE LOCATION IN REFLUX RAIL OF SUBWAY/COAL MINE AND TRANSITION RESISTANCE THEREOF

CROSS REFERENCE TO THE RELATED APPLICATIONS

This application is the national phase entry of the International Application No. PCT/CN2019/083798, filed on Apr. 23, 2019, which is based upon and claimed priority to Chinese Patent Application No. 201811375321.4, filed on Nov. 19, 2018, the entire contents of which are incorporated herein by reference.

TECHNICAL FIELD

The present invention relates to the field of rail detection technologies, and in particular, to a method for detecting an insulation damage location in a reflux rail of a subway/coal mine and a transition resistance thereof.

BACKGROUND

In a transportation system such as a coal mine or subway that uses a direct-current traction locomotive, the direct-current traction locomotive is one of the primary transportation apparatuses required for production and life. When the direct-current traction locomotive is running on a reflux rail, a traction current is obtained from a positive electrode of a substation through a tunnel overhead line and a feeder line and returns to a negative electrode of the substation through the reflux rail. Therefore, when damage occurs in the ground insulation of the reflux rail, a part of the traction current leaks from a ground insulation damage location to the ground to form a stray current in a coal mine shaft or subway. The dangers of stray currents in coal mines mainly include triggering premature explosion of an electrical detonator, causing gas and dust explosion accidents in the mine, corroding metal housings of underground metal pipes and armored cables in the coal mine, and affecting the normal operation of underground electrical equipment in the coal mine. A stray current of a subway electrochemically corrodes reinforcing steel bars in building structures, metal housings of equipment, and other underground metal pipelines to adversely affect the service life of the building structures, the equipment, and other metal pipelines.

In a transportation system such as a coal mine or subway that uses a direct-current traction locomotive, when the locomotive is powered by only a single substation, such a power mode is referred to as a single-side single-locomotive power mode. To ensure safe and stable operation of a coal mine system, a subway system, or the like, it is essential to discover a ground insulation damage location in a reflux rail in time to radically prevent the formation of a stray current. Therefore, it is urgent to figure out a method for precisely locating a ground insulation damage location in a reflux rail in a single-side single-locomotive power mode. However, at present only initial research has been performed in this area. A method for locating a ground insulation damage location in a reflux rail based on a C traveling wave solution (LIU Jianhua, et al., Urban Mass Transit, 2015.09) is found by searching existing literature. In this method, a traveling wave signal needs to be injected into a reflux rail in which insulation damage occurs. The traveling wave signal is reflected at an insulation damage location back to an injection location of the signal. The insulation damage location is located according to the time taken for the signal to make a round trip between the injection location and the insulation damage location and the wave speed of the traveling wave signal. The feasibility and accuracy of this method are only verified through simulation, and need to be verified through further engineering practice.

SUMMARY

In view of the foregoing problem, the present invention provides a method for detecting an insulation damage location in a reflux rail of a subway/coal mine and a transition resistance thereof. In the method, according to an inventive concept that a potential at a reflux rail location connected to a negative electrode of a substation jumps when a direct-current traction locomotive travels past a ground insulation damage location in a reflux rail, a ground insulation damage location in a reflux rail is directly, conveniently, and precisely detected on line in real time. The detection principle and concept are ingenious, with a simple detection system structure and the acceptable costs. The present invention is particularly applicable to an application field such as a coal mine or subway that uses a direct-current traction locomotive.

To achieve the objective of the present invention, the technical solution adopted in the present invention is a method for detecting an insulation damage location in a reflux rail of a subway/coal mine and a transition resistance thereof, including:

S1: connecting a reflux rail 1 to a negative electrode of a substation 2 by a cable, and selecting a location 11 at a connecting point as a reference location;

S2: mounting a potential detection apparatus 3 at the reference location selected in step S1, and acquiring potential data at the reference location at a moment; and meanwhile, mounting a travel distance detection apparatus 5 and a traction current detection apparatus 6 on a locomotive 4 to respectively acquire travel distance data and traction current data of the locomotive 4 at a moment;

S3: traveling, by the locomotive 4, to the substation 2 along the reflux rail 1, during traveling, continuously acquiring, by the potential detection apparatus 3, the travel distance detection apparatus 5, and the traction current detection apparatus 6, the potential data, the travel distance data, and the traction current data respectively, where sampling frequencies are all 1000 Hz, controlling, by a control unit 7, the synchronization of acquisition time of the potential detection apparatus 3, the travel distance detection apparatus 5, and the traction current detection apparatus 6, and sending, by the potential detection apparatus 3, the travel distance detection apparatus 5, and the traction current detection apparatus 6, the acquired data to the control unit 7 respectively in a wireless communication manner;

S4: traveling, by the locomotive 4, to the reference location and stopping running, and completing, by the potential detection apparatus 3, the travel distance detection apparatus 5, and the traction current detection apparatus 6, data acquisition and stopping working; and discriminating, by the control unit 7 according to a rule that a potential jump occurs when a potential change between adjacent sampling intervals exceeds a preset value, a potential jump and a corresponding jump time from the received potential data, where the preset value may be set according to an actual requirement, because the potential detection apparatus 3 and the travel distance detection apparatus 5 have synchronous acquisition time, taking, by the control unit 7, the travel distance data acquired by the travel distance detection apparatus 5 when the locomotive 4 travels to the reference location as a total running length $L_1$ of the locomotive 4, determining a running distance $L_2$ of the locomotive 4 at a jump moment from the received travel distance data, and using a difference value between the total running length $L_1$ and the running distance $L_2$ as a distance L between a ground insulation damage location 12 in the reflux rail 1 and the reference location, that is, $L=L_1-L_2$, to locate a ground insulation damage location in the reflux rail 1; and S5: determining, by the control unit 7, a traction current of the locomotive 4 at the jump moment from the received traction current data and defining the traction current as I, determining a potential at the reference location at the jump moment from the received potential data and defining the potential as v, and calculating, by the control unit 7, a transition resistance $R_Z$ at the ground insulation damage location 12 in the reflux rail 1 according to the distance L between the ground insulation damage location 12 in the reflux rail 1 and the reference location determined in step S4 and a longitudinal resistance $R_t$ and a transition resistance $R_g$ of the reflux rail 1 and by using the following formula:

$$R_z = -\frac{I \cdot \sqrt{R_t \cdot R_g} \cdot \left[\exp\left(\sqrt{R_t/R_g} \cdot L\right) - \exp\left(-\sqrt{R_t/R_g} \cdot L\right)\right] + v\left[\exp\left(\sqrt{R_t/R_g} \cdot L\right) + \exp\left(-\sqrt{R_t/R_g} \cdot L\right)\right]}{\exp\left(\sqrt{R_t/R_g} \cdot L\right) + \exp\left(-\sqrt{R_t/R_g} \cdot L\right) - 2}$$

where the longitudinal resistance and transition resistance of the reflux rail 1 are detected physical quantities in a subway or coal mine system.

The locomotive 4 is a direct-current traction locomotive.

The potential detection apparatus 3 is formed by a voltage transmission module, a data acquisition module, and a wireless communications module; the reference location is connected to the voltage transmission module by a signal cable; the voltage transmission module converts a potential signal at the reference location according to a data type and range that are permitted by the data acquisition module, and the data acquisition module acquires and processes the converted data and sends the data to the control unit 7 by using the wireless communications module.

The travel distance detection apparatus 5 is formed by a rotary encoder, a programmable controller, and a wireless communications module; the rotary encoder is mounted on a wheel axle of the locomotive 4; the rotary encoder converts a speed signal of the locomotive 4 into a high-speed pulse train to be acquired by a high-speed counter of the programmable controller; a quantity of high-speed pulses generated when a wheel rotates one revolution and the circumference of the wheel are both known quantities, and the programmable controller calculates a quantity of revolutions of the wheel of the locomotive 4, uses a product of multiplying the quantity of revolutions by the circumference as the running distance of the locomotive 4, and sends the running distance to the control unit 7 by using the wireless communications module.

The traction current detection apparatus 6 includes a fiber current transformer and a wireless communications module, and the fiber current transformer detects the traction current of the locomotive 4 and sends the traction current to the control unit 7 by using the wireless communications module.

Compared with the prior art, by means of the method for detecting an insulation damage location in a reflux rail of a subway/coal mine and a transition resistance thereof in the present invention, according to an inventive concept that a potential at a reflux rail location connected to a negative electrode of a substation jumps when a direct-current traction locomotive travels past a ground insulation damage location in a reflux rail, a ground insulation damage location in a reflux rail and a transition resistance thereof are directly, conveniently, and precisely detected on line in real time. In addition, a detection system built in the present invention has a simple structure, facilitates fast arrangement, requires acceptable costs, produces detection results with clear and obvious features, and is particularly applicable to an application field such as a coal mine or subway that uses a direct-current traction locomotive.

BRIEF DESCRIPTION OF THE DRAWINGS

FIG. 1 shows a schematic diagram of a power mode before a locomotive travels past a ground insulation damage location according to the present invention.

Where: 1—reflux rail, 2—substation, 3—potential detection apparatus, 4—locomotive, 5—travel distance detection apparatus, 6—traction current detection apparatus, 7—control unit, 11—reference location, and 12—ground insulation damage location.

DETAILED DESCRIPTION OF THE EMBODIMENTS

The technical solutions of the present invention are further described below with reference to the accompanying drawings and embodiments.

A method for detecting an insulation damage location in a reflux rail of a subway/coal mine and a transition resistance thereof in the present invention is shown in FIG. 1. The method specifically includes:

S1: connecting a reflux rail 1 to a negative electrode of a substation 2 by a cable, and selecting a location 11 at a connecting point as a reference location;

S2: mounting a potential detection apparatus 3 at the reference location selected in step S1, and acquiring potential data at the reference location at a moment; and meanwhile, mounting a travel distance detection apparatus 5 and a traction current detection apparatus 6 on a locomotive 4 to respectively acquire travel distance data and traction current data of the locomotive 4 at a moment;

S3: traveling, by the locomotive 4, to the substation 2 along the reflux rail 1, during traveling, continuously acquiring, by the potential detection apparatus 3, the travel distance detection apparatus 5, and the traction current detection apparatus 6, the potential data, the travel distance data, and the traction current data respectively, where sampling frequencies are all 1000 Hz, controlling, by a control unit 7, the synchronization of acquisition time of the potential detection apparatus 3, the travel distance detection apparatus 5, and the traction current detection apparatus 6, and sending, by the potential detection apparatus 3, the travel distance detection apparatus 5, and the traction current detection apparatus 6, the acquired data to the control unit 7 respectively in a wireless communication manner;

S4: traveling, by the locomotive 4, to the reference location and stopping running, and completing, by the potential detection apparatus 3, the travel distance detection apparatus 5, and the traction current detection apparatus 6, data acquisition and stopping working; discriminating, by the control unit 7 according to a rule that a potential jump occurs when a potential change between adjacent sampling intervals exceeds a preset value, a potential jump and a corresponding jump time from the received potential data, where the preset value may be set according to an actual requirement, for example the preset value set is 1V; and because the acquisition time of the potential detection apparatus 3 and the acquisition time of the travel distance detection apparatus 5 are synchronized, taking, by the control unit 7, the travel distance data acquired by the travel distance detection apparatus 5 when the locomotive 4 travels to the reference location as a total running length $L_1$ of the locomotive 4, determining a running distance $L_2$ of the locomotive 4 at a jump moment from the received travel distance data, and using a difference value between the total running length $L_1$ and the running distance $L_2$ as a distance L between a ground insulation damage location 12 in the reflux rail 1 and the reference location, that is, $L=L_1-L_2$, to locate a ground insulation damage location in the reflux rail 1; and S5: determining, by the control unit 7, a traction current of the locomotive 4 at the jump moment from the received traction current data and defining the traction current as I, determining a potential at the reference location at the jump moment from the received potential data and defining the potential as V, and calculating, by the control unit 7, a transition resistance $R_z$ at the ground insulation damage location 12 in the reflux rail 1 according to the distance L between the ground insulation damage location 12 in the reflux rail 1 and the reference location determined in step S4 and a longitudinal resistance $R_t$ and a transition resistance $R_g$ of the reflux rail 1 and by using the following formula:

$$R_z = -\frac{I \cdot \sqrt{R_t \cdot R_g} \cdot [\exp(\sqrt{R_t/R_g} \cdot L) - \exp(-\sqrt{R_t/R_g} \cdot L)] + v[\exp(\sqrt{R_t/R_g} \cdot L) + \exp(-\sqrt{R_t/R_g} \cdot L)]}{\exp(\sqrt{R_t/R_g} \cdot L) + \exp(-\sqrt{R_t/R_g} \cdot L) - 2}$$

where the longitudinal resistance and transition resistance of the reflux rail 1 are detected physical quantities in a subway or coal mine system.

The locomotive 4 is a direct-current traction locomotive.

The potential detection apparatus 3 is formed by a voltage transmission module, a data acquisition module, and a wireless communications module, the reference location is connected to the voltage transmission module by a signal cable, the voltage transmission module converts a potential signal at the reference location according to a data type and range that are permitted by the data acquisition module, and the data acquisition module acquires and processes the converted data and sends the data to the control unit 7 by using the wireless communications module.

The travel distance detection apparatus 5 is formed by a rotary encoder, a programmable controller, and a wireless communications module, the rotary encoder is mounted on a wheel axle of the locomotive 4, the rotary encoder converts a speed signal of the locomotive 4 into a high-speed pulse train to be acquired by a high-speed counter of the programmable controller, a quantity of high-speed pulses generated when a wheel rotates one revolution and the circumference of the wheel are both known quantities, and the programmable controller calculates a quantity of revolutions of the wheel of the locomotive 4, uses a product of multiplying the quantity of revolutions by the circumference as the running distance of the locomotive 4, and sends the running distance to the control unit 7 by using the wireless communications module.

The traction current detection apparatus 6 includes a fiber current transformer and a wireless communications module, and the fiber current transformer detects the traction current of the locomotive 4 and sends the traction current to the control unit 7 by using the wireless communications module.

The foregoing only provides preferred embodiments of the present invention, but is not intended to limit the present invention in any form. All other embodiments obtained by a person of ordinary skill in the art based on the embodiments of the present invention without creative effort fall within the scope of protection of the present invention. Any simple modification or equivalent change made to the foregoing embodiments according to the technical essence of the present invention falls within the scope of protection of the present invention.

What is claimed is:

1. A method for detecting an insulation damage location in a reflux rail of a subway/coal mine and a transition resistance thereof, comprising the following steps:

S1: connecting a reflux rail to a negative electrode of a substation by a cable, and selecting a location at a connecting point as a reference location;

S2: mounting a potential detection apparatus at the reference location selected in step S1, and acquiring potential data at the reference location at a moment; and meanwhile, mounting a travel distance detection apparatus and a traction current detection apparatus on a locomotive to respectively acquire travel distance data and traction current data of the locomotive at a moment;

S3: traveling, by the locomotive, to the substation along the reflux rail, during traveling, continuously acquiring, by the potential detection apparatus, the travel distance detection apparatus, and the traction current detection apparatus, the potential data, the travel distance data, and the traction current data respectively, controlling, by a control unit, a synchronization of acquisition time of the potential detection apparatus, the travel distance detection apparatus, and the traction current detection apparatus, and sending, by the potential detection apparatus, the travel distance detection apparatus, and the traction current detection apparatus, the acquired data to the control unit respectively in a wireless communication manner;

S4: discriminating, by the control unit according to a rule wherein a potential jump occurs when a potential change between adjacent sampling intervals exceeds a preset value, a potential jump time and a corresponding jump time from the received potential data; and taking, by the control unit, the travel distance data acquired by the travel distance detection apparatus (5) when the locomotive travels to the reference location as a total running length $L_1$ of the locomotive, determining a running distance $L_2$ of the locomotive at a jump moment from the received travel distance data, and using a difference value between the total running length $L_1$ and the running distance $L_2$ as a distance L between a ground insulation damage location in the reflux rail and the reference location, that is, $L=L_1-L_2$; and S5: determining, by the control unit, a traction current of the locomotive at the jump moment from the received traction current data and defining the traction current as I, determining a potential at the reference location at the jump moment from the received potential data and defining the potential as v, and calculating, by the control unit, a transition resistance $R_z$ at the ground insulation damage location in the reflux rail according to the distance L between the ground insulation damage location in the reflux rail and the reference location determined in step S4 and a longitudinal resistance $R_t$ and a transition resistance $R_g$ of the reflux rail and by using the following formula:

$$R_z = -\frac{I \cdot \sqrt{R_t \cdot R_g} \cdot [\exp(\sqrt{R_t/R_g} \cdot L) - \exp(-\sqrt{R_t/R_g} \cdot L)] + v[\exp(\sqrt{R_t/R_g} \cdot L) + \exp(-\sqrt{R_t/R_g} \cdot L)]}{\exp(\sqrt{R_t/R_g} \cdot L) + \exp(-\sqrt{R_t/R_g} \cdot L) - 2}.$$

2. The method for detecting an insulation damage location in a reflux rail of a subway/coal mine and a transition resistance thereof according to claim 1, wherein the locomotive is a direct-current traction locomotive.

3. The method for detecting an insulation damage location in a reflux rail of a subway/coal mine and a transition resistance thereof according to claim 1, wherein the potential detection apparatus is formed by a voltage transmission module, a data acquisition module, and a wireless communications module, the reference location is connected to the voltage transmission module by a signal cable, the voltage transmission module converts a potential signal at the reference location according to a data type and range are permitted by the data acquisition module, and the data acquisition module acquires and processes the converted data and sends the data to the control unit by using the wireless communications module.

4. The method for detecting an insulation damage location in a reflux rail of a subway/coal mine and a transition resistance thereof according to claim 1, wherein the travel distance detection apparatus is formed by a rotary encoder, a programmable controller, and a wireless communications module, the rotary encoder is mounted on a wheel axle of the locomotive, the rotary encoder converts a speed signal of the locomotive into a high-speed pulse train to be acquired by a high-speed counter of the programmable controller, and the programmable controller calculates a quantity of revolutions of the wheel axle of the locomotive, uses a product of multiplying the quantity of revolutions by a circumference as the running distance of the locomotive, and sends the running distance to the control unit by using the wireless communications module.

5. The method for detecting an insulation damage location in a reflux rail of a subway/coal mine and a transition resistance thereof according to claim 1, wherein the traction current detection apparatus comprises a fiber current transformer and a wireless communications module, and the fiber current transformer detects the traction current of the locomotive and sends the traction current to the control unit by using the wireless communications module.

* * * * *